United States Patent [19]

Grijol et al.

[11] Patent Number: 5,064,780
[45] Date of Patent: Nov. 12, 1991

[54] METHOD OF OBTAINING A TERNARY MONOCRYSTALLINE LAYER BY MEANS OF HETERO-EPITAXY ON A BINARY LAYER AND A CRUCIBLE SUITABLE FOR PUTTING THE METHOD INTO EFFECT

[75] Inventors: Laurent Grijol; Catherine Le Martret; Beatrice Baladi, all of Caen, France

[73] Assignee: U.S. Philips Corporation, New York, N.Y.

[21] Appl. No.: 329,739

[22] Filed: Mar. 28, 1989

[30] Foreign Application Priority Data

Mar. 29, 1988 [FR] France ................. 88 04077

[51] Int. Cl.[5] ........................................ H01L 21/208
[52] U.S. Cl. .................................... 437/130; 437/121; 437/127; 437/133; 156/622
[58] Field of Search ............... 437/130, 121, 133, 127; 156/622

[56] References Cited

U.S. PATENT DOCUMENTS

| | | | |
|---|---|---|---|
| 3,762,367 | 10/1973 | Nishizawa et al. | 437/133 |
| 4,001,055 | 1/1977 | Charmakadze et al. | 437/130 |
| 4,606,780 | 8/1906 | Leibenzeder et al. | 437/127 |
| 4,755,485 | 7/1988 | Tsai | 437/127 |
| 4,946,801 | 8/1990 | Sato et al. | 437/130 |

FOREIGN PATENT DOCUMENTS

| | | |
|---|---|---|
| 16535 | 1/1983 | Japan ............... 437/127 |
| 21282 | 1/1988 | Japan . |
| 77118 | 3/1989 | Japan . |
| 79422 | 3/1990 | Japan . |

OTHER PUBLICATIONS

K. Kurata et al., "An Experimental Study on Improvement of Performance for Hemispherically Shaped High-Power IRED's with $Ga_{1-x}Al_xAs$ Grown Junctions", IEEE Transactions on Electron Devices. vol. ED-28, No. 4, Apr. 1981, pp. 374–379.

W. W. Rühle et al., "A (Ga,Al) As Semiconductor Scintillator with Monolithically Integrated Photodiode: A New Detector"; IEEE Transactions on Nuclear Science, vol. NS-30, No. 1, Feb. 1983, pp. 436–439.

J. Lebailly et al., "Comparison of the Aging Behavior of Diffused and Epiaxial GaAlAs Heterojunction Electroluminescent Diodes", IEEE Transactions on Electron Devices, vol. ED-28, No. 4, Apr. 1981, pp. 390–394.

J. Varon et al., "High Brightness GaAlAs Heterojunction RED LED's", IEEE Transactions on Electron Devices, vol. ED-28, No. 4, Apr. 1981, pp. 416–420.

Primary Examiner—Brian E. Hearn
Assistant Examiner—Linda J. Fleck
Attorney, Agent, or Firm—Norman N. Spain

[57] ABSTRACT

The invention relates to a method of obtaining by heteroepitaxy a monocrystalline layer of a ternary compound on a monocrystalline substrate of a binary composition, in which a saturated solution (A) of the ternary compound is brought into contact with the substrate (90), the assembly being raised to a first temperature, and is thereafter cooled to a second temperature.

The dynamics of the epitaxial growth is improved in accordance with the invention by placing the substrate (90) on the surface of the solution (A).

6 Claims, 4 Drawing Sheets

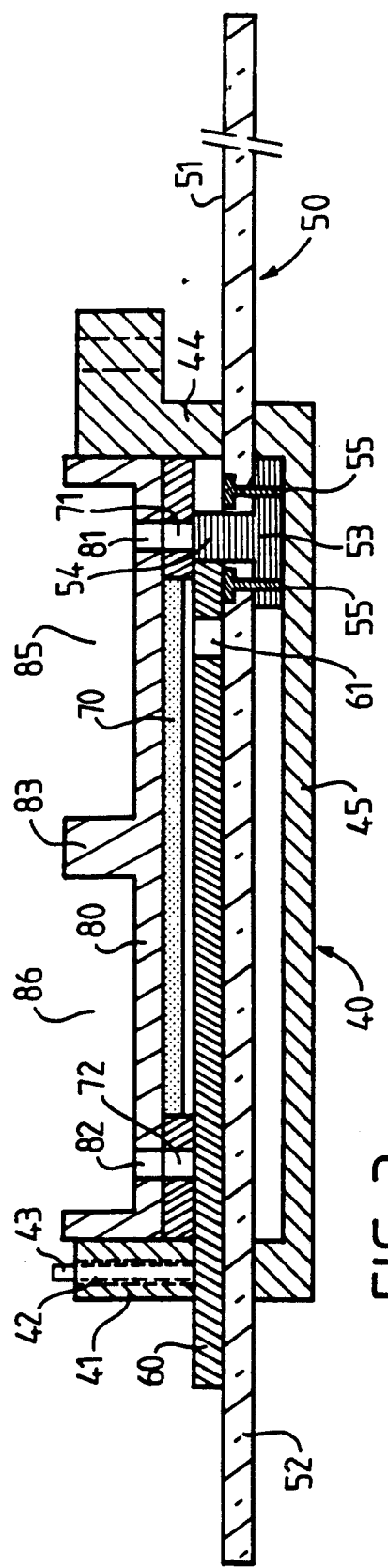
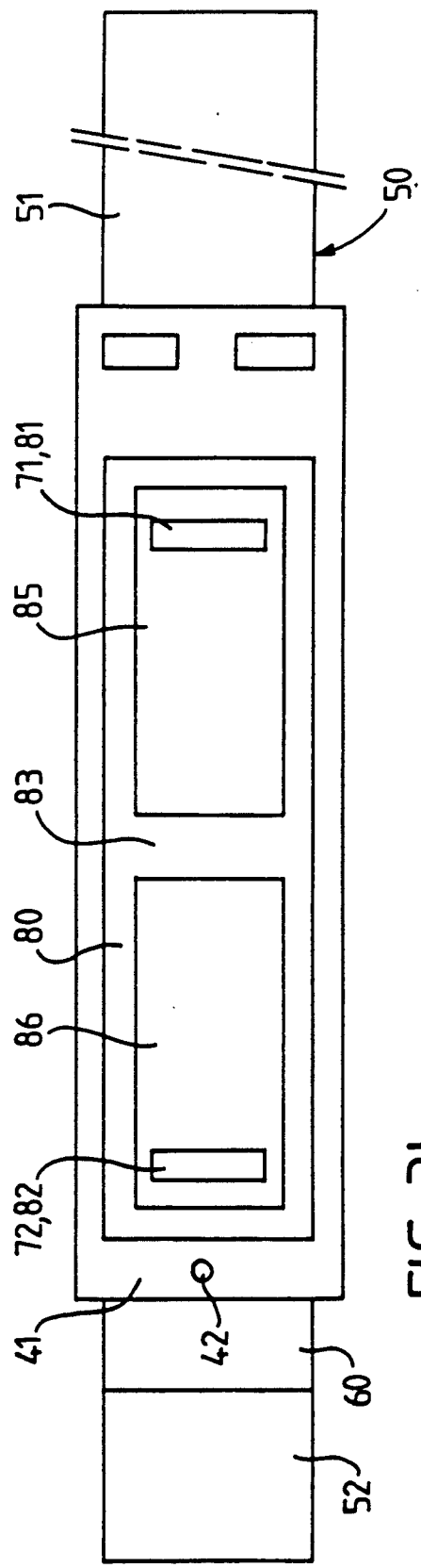
FIG. 3a
FIG. 3b

METHOD OF OBTAINING A TERNARY MONOCRYSTALLINE LAYER BY MEANS OF HETERO-EPITAXY ON A BINARY LAYER AND A CRUCIBLE SUITABLE FOR PUTTING THE METHOD INTO EFFECT

BACKGROUND OF THE INVENTION

The present invention has for its object to provide a method of obtaining by liquid hetero-epitaxy at least one monocrystalline layer of a ternary compound on at least one monocrystalline substrate of a binary composition, in which a solution saturated with the ternary compound is brought into contact with said the substrate, the assembly being raised uniformly to a first temperature, thereafter cooled at a first temperature decreasing rate to a second temperature in such a manner as to effect the resultant epitaxy, said layer having a thickness equal to at least 100 microns.

In accordance with the prior art, this conventional method renders it possible to obtain with a maximum thickness of approximately 100 microns a epitaxy-produced layer. A crucible corresponding to this method is disclosed in Applicants' Patent FR 1600341.

The technique used consists in placing one or a plurality of GaAs substrates in a crucible and covering them by a saturated ternary solution (GaAlAs). The growth thickness is limited because of the fact that the solution becomes locally poor in Al proportionally to the growth and the cooling. Producing transparent diodes on a transparent GaAlAs substrate, which combine a high efficiency with a low power consumption, requires a ternary layer having a thickness of at least 150 microns.

Several recently published articles, more specifically the articles published in "Electronique Industrielle", no. 133, November 1987, pp. 27–28, explicitly state that the technological problems as regards the production of 150 micron thick GaAlAs layer are not resolved. Especially the voltage outlets of light-emitting diodes having a transparent substrate appear to be very important.

It is moreover clear that the methods which are known at present and have for their object to improve the epitaxial growth conditions originate from laboratory techniques, which are not suitable for use in industrial production methods a satisfactory cost.

A known method which improves the growth of layers of a binary composition, specifically of GaAs, has been proposed by J. T. DALY et al in the Journal of Crystal Growth 78 (1986), North Holland pp. 291–302. It consists in producing a permanent laminar circulation of the solution on the substrate in such manner as to ensure that the solution is constantly saturated at the interface with the substrate. This method is complicated and difficult to implement and because of its cost it is more suitable for laboratory activities than for industrial manufacture.

In addition, no evaluation has as yet been made as regards its ultimate efficiency for the growth of ternary layers.

L. E. STONE et al. in "Growth of thick $Ga_xAl_{1-x}As$ layers by liquid phase epitaxy" (Texas Instruments Inc) have suggested a method to produce thick GaAlAs layers, in which a GaAs substrate is deposited on the surface of a saturated solution, the assembly being placed in an oven which does not only produce a homogeneous temperature of the assembly, but a vertical temperature gradient, which ensures the motion of ternary material in the liquid phase and a continuing growth. The growth is effected at a constant temperature or with not more than a slight temperature decrease in the course of time.

This second prior-art method renders it possible to process the substrates one-by-one, and its is not suitable for either a collective processing of substrates, nor for the successive realization, without complete cooling of the substrates, of several epitaxy layers. In addition, the stabilization of the temperature gradient is comparatively long. This method is therefore not at all suitable for industrial application.

The present invention therefore has for its object to provide an improved method for the manufacture of layers for example made of GaAlAs, by means of hetero-epitaxy on a binary substrate, for example made of GaAs, in such a manner as to obtain greater thicknesses, of the order of 200 microns and more for the GaAlAs.

The invention is based on the idea to utilize the existence of a polycrystalline crust on the bath surface, at the end of a conventional large-thickness epitaxy (approximately 100 microns) effected in a crucible in which the substrate is covered by the solution and, cooling with a temperature decrease between two temperatures. Applicants have found that this crust was of a ternary composition, consequently containing 50% of arsenic, and have put forward the hypothesis that the crust originates from GaAlAs micro-nuclei which form spontaneously during the decrease in temperature and which, being less dense than the solution, start floating on the bath surface, forming a solid mass there.

Now, to obviate the phenomenon that the As solution becomes poor in the region of the crystalline growth interface, efforts have been made to provide a circulation which is adequate to locally enrich the As solution.

Applicants have found that by placing the substrate to be epitaxied into contact with the surface of the solution, which could a prior; be advised against because of precisely the formation of an unwanted crust at the end of the epitaxy operation on this surface, it is possible to obtain much greater epitaxy-produced thicknesses, all the other factors remaining the same, than in the case in which the substrate is covered by the solution. Applicants explain this surprising phenomenon from the fact that these nuclei which are rich in As and flow at the level of the crystallization interface, are dissolved again in the interface layer between the solution poor in As and the solutions enriched in As, which renders it possible to proceed still further proceed with the growth.

The method according to the invention is therefore characterized, in that said contacting the first solution of the ternary compound, for example doped GaAlAs, with the substrate, for example made of doped GaAs and being of the opposite type is realized by placing a lower surface of said substrate into contact with the surface of said solution, in that the first temperature is comprised between 850° and 880° C., in that the second temperature is of the order of 700° C. and in that the first temperature decreasing rate is comprised between 0.6° and 1.2° C./mn.

It should furthermore be noted that from the U.S. Pat. No. 3,762,367 it is known to effect an epitaxial growth by placing a substrate on the successive surfaces of several epitaxial solutions, but the method thus described specifically relates to thin epitaxial layers (not more than 12 microns) with temperature decreases of not more than 20° C. In these conditions and at these temperatures, the phenomenon of a possible formation of a crust at the surface of the solution is not absolutely certain to occur. This phenomenon of a crust forming on the surface of the solution actually occurs when a layer of a great thickness is produced by epitaxy. Consequently, the U.S. Pat. No. 3,762,367 does not have any teachings to overcome the opinion of a person skilled in the art as regards this type of technique, for the realization of layers of a great thickness.

In accordance with a preferred variation, the method includes a final stage in which the epitaxied substrate is placed in contact with the surface of a second saturated solution of the ternary compound, the assembly being cooled at a given second temperature decreasing rate to a third temperature in such manner as to obtain a second monocrystalline layer, more specifically in such manner as to provide a junction between two epitaxied layers and, for example, to finish the manufacturing operations with a second layer of a conventional thickness for forming a light-emitting diode. Thus, it is no longer necessary for the epitaxied substrate to be cooled to ambient temperature between the two epitaxy operations.

The method may include, more specifically in view of the production of light-emitting diodes with a transparent GaAlAs substrate, a stage in which the substrate of the binary composition is removed.

The invention also relates to a crucible for double-bath epitaxy in which the substrates to be epitaxied are placed in a substrate carrier member arranged in a crucible member, and comprising at least one slide which, when displaced, renders it possible to bring the substrates successively into contact with the two epitaxy baths.

Such a crucible is disclosed more specifically in the French Patent Specification FR 1600341, filed by Applicants. In this case the slide is formed by the substrate carrier member itself and the solutions come into contact with the substrates disposed on the bottom of the carrier substrate member slide.

For the above-described reasons, the desired mode of epitaxy is to place the substrates into contact with the surface of the liquid, and, moreover, to effect two epitaxies one after the other, the first one to obtain a transparent substrate, and the second to form a diode therewith, which avoids the necessity of an intermediate cooling of the epitaxied substrate and consequently prevents the disadvantage of any oxidation of Al.

Therefore, the crucible according to the invention is characterized, in that the substrate carrier member is in a fixed translational relation to the crucible member, in that a centre region is present in which a receptacle is formed having a bottom provided with at least one aperture which covers a large portion of the lower surface of the substrates when in position there, in that it has first and second slits arranged in raised edges bounding said centre regions on both sides, in that it includes, arranged above the substrate carrier member a solution carrier member which is in a fixed translational relation with the crucible member and contains a first and a second reservoir intended to receive a first and a second epitaxy solution, respectively, and whose bottom has a third and a fourth slit arranged directly over the first and second slits, in that it comprises, arranged below the substrate carrier member, a first slide which, in a centre region, has a raised edge having an upper surface of a size which is at least equal to that of the first and second slides, and a first and a second portion on both sides of the raised edge, in that it has a second slide which is superposed on the second portion of the first slide, the second slide having a thickness substantially equal to the thickness of said raised edge and having, near an edge which is contiguous to said raised edge, a hole which can accommodate a locking pin which by means of its weight rests on the upper surface of the second slide, the locking pin being provided at a first end of the body of the crucible contiguous to the second reservoir, such that the first slide is capable of translation between a rear position in which it abuts on a second end of the body of the crucible contiguous to the first reservoir and a leading position wherein, on the one hand, the raised edge of the first slide then being in a position in which it does no longer close the first slit, the first solution which has flowed over the first portion of the first slide just grazes the lower surface of the substrate and wherein, on the other hand, the locking pin has dropped back by its own weight into the hole of the second slide, which because of the return of the first slide to the rear position causes the first solution to flow back to the first reservoir and the second solution to flow over the second portion of the first slide in such a manner that it grazes the lower surface of the substrate.

In accordance with a preferred embodiment, the aperture in the substrate carrier member has ribs which are spaced apart in such a manner as to receive the edges of the substrate, and the substrates are covered by a plate of the same dimensions as the receptacle.

This renders it possible to ensure that the solution will not contaminate the upper surface of the substrates, and limits its flow.

The invention and how it can be put into effect will be better understood from the following description which is given by way of non-limitative example with reference to the accompanying drawings, wherein:

FIGS. 3a and 3b are respective vertical cross-sectional plan views of a crucible for putting the method according to the invention into effect, and FIG. 3c is a plan view of the substrate carrier member.

Figure 5A:
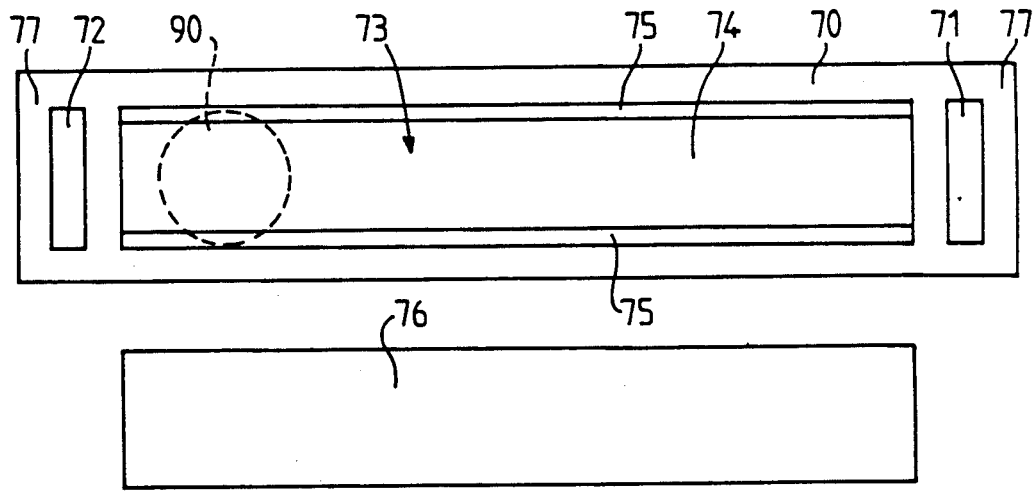
Figure 5A:
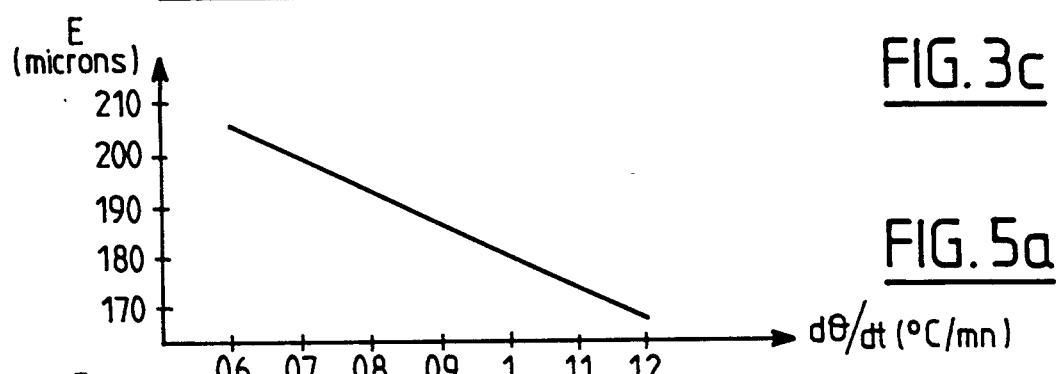
Figure 5B:
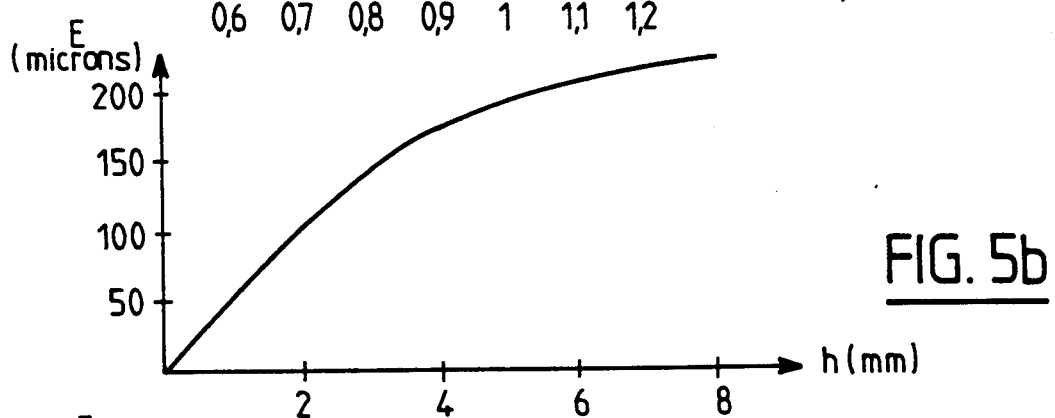
Figure 5C:
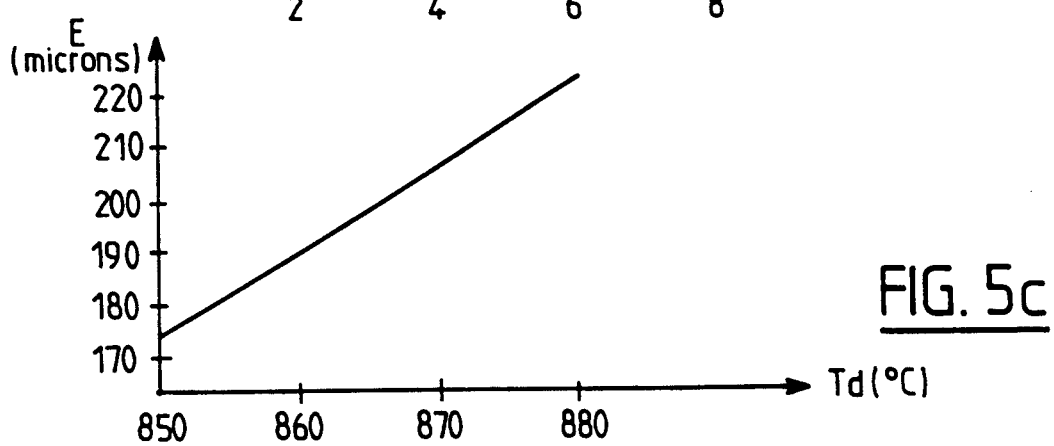

FIGS. 5a and 5c show respectively the epitaxial growth curves of GaAlAs on GaAs substrates and the layer thickness as a function of the rate of decrease of the temperature to a given starting temperature, the thickness of the layer as a function of the height of the solution at a given starting temperature, and the thickness of the epitaxial layer versus the starting temperature at the given temperature decreasing rate.

Figure 1:
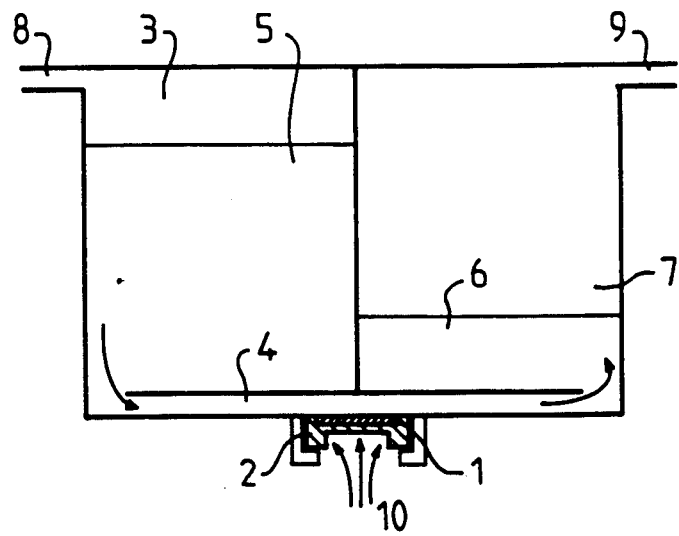
FIGS. 1 and 2 illustrate two prior-art methods, a method in which a continuous laminar circulation of the solution and a vertical temperature gradient are used, respectively.

FIG. 1 illustrates the epitaxial growth technique by means of the laminar solution flow used by J. T. DALY et al. for the growth of GaAs. A saturated solution 5 having a temperature $T_0$ contained in a reservoir 3 positioned at the left of the Figure is connected via a narrow rectangular channel 4 to a reservoir 7 which is shown at the right of the Figure. A gas injection at 8 produces an pressure increase which results in a circulation of the solution 5 through the channel 4, towards the reservoir 7. A substrate carrier member 2 keeps a substrate 1 into contact with the solution in a point in the channel 4 where the flow of the solution is a laminar flow. The substrate 1 is cooled to a temperature $T'$ less than $T_0$ during the total epitaxy method, thanks to a gas circulation 10. This technique has only been evaluated for growing layers of a binary composition and in any case it requires the use of a complicated, large-size equipment because of the required quantity of solution (100 cm$^3$) in which it is therefore difficult to control the temperature. The processing of a significant quantity of substrates appeared difficult to achieve. For all these reasons, the method is not suitable for industrial production.

Figure 2:
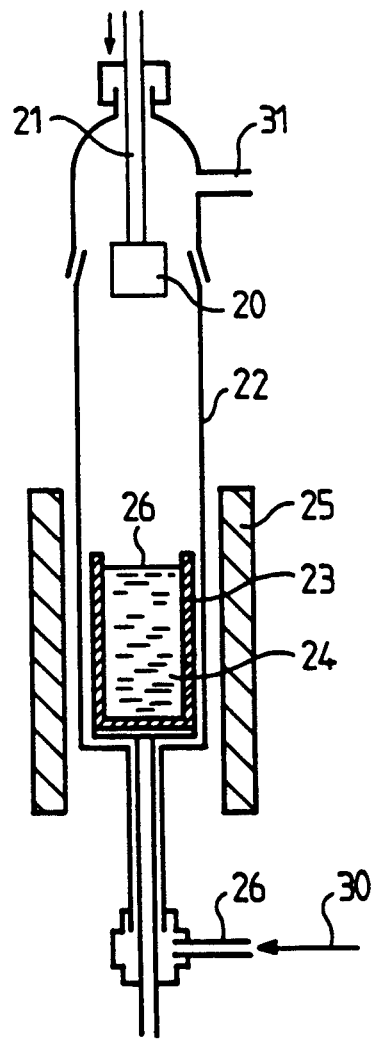

FIG. 2 corresponds to the method of growing a layer of a ternary composition, of the type described by the STONE et al. in said article.

A crucible 23 filled with a Ga solution 24 is placed in an oven 25 and a substrate 20 is brought into contact with the surface 26 of the solution 24. The growth principle is the transport of ternary material while putting a temperature gradient into effect. To this end a solid ternary source is placed in the solution at a level thereof which is 10° C. hotter than the substrate 20. Due to the difference in solubility because of the temperature gradient, a migration and a transportation of the material is produced and keeps the growth going.

The growth is realized only on the basis of material which circulates by heat-migration. The actual growth is not rapid (less than one micron per minute). A drawback is the stabilization of the temperature gradient which takes approximately four hours for an oven in which only one substrate is processed.

Moreover, it is almost impossible to manufacture ovens having a temperature gradient which allows the processing of a plurality of substrates because of problems as regards the uniformity of the temperature which would occur with such geometries.

In contrast thereto, according to the invention, the epitaxy of ternary layers is performed in conditions which are very close to conventional liquid epitaxy methods. Actually, which will be shown in the description that follows, there is no need to provide a laminar circulation in the solution nor to put a temperature gradient into effect, but to make use of a secondary phenomenon which so far has only been detected but has not yet been analysed.

This phenomenon is the appearance of a polycrystalline crust of a ternary composition at the surface of the bath at the end of the epitaxy. More specifically an analysis of the composition of this crust shows that it is not the formed because of local crystallization on the solution, but that it stems from elements which have migrated to this place. As the solution does not have a temperature gradient which, but only in very precise conditions, would have been able to cause a migration. Applicants have evolved the hypothesis that solid micronuclei are involved which are produced locally and spontaneously in the epitaxy bath and start floating on the surface.

The invention is therefore based on the idea that, if the substrates to be epitaxied are placed on the surface of the epitaxy bath these micro-nuclei, instead of disturbing the epitaxy as was formerly thought, actually promote the epitaxy as they are redissolved at the interface of the epitaxy from which As has been removed and thus enrich it again with As, which renders it possible to continue the growth for a much longer period of time.

Now a crucible by means of which an epitaxy in accordance with the invention may be carried out will be described by way of example. This crucible is designed so as to contain two solutions, which, if so desired, allows two epitaxies one after the other without the necessity of cooling the substrate and to remove it from the epitaxy oven.

Such a cooling would not only prolong the production time but can also have drawbacks in that there is a risk of oxidation of the Al in the GaAlAs layer, which would be detrimental to the ultimate epitaxy.

The crucible has a crucible member 40 having a first end 41 provided with a bore 42 which can accommodate a pin 43, and a second end 44 and a bottom 45. A substrate carrier member 70 which is in a fixed translational relation with the body of the crucible 40 is sandwiched, at its upper portion, between a solution carrier member 80 and a mobile system which is capable of reciprocating and includes two slides 50 and 60.

The solution carrier member 80 has two reservoirs 85 and 86 which are separated by a raised edge 83 and each has a slit in its bottom, 81 and 82, respectively, intended for having the solution flow across corresponding slits positioned precisely therebelow, 71 and 72, respectively, which are made in two ends on the raised edges of the substrate carrier member 70.

The first slide 50 has a central portion which is provided with a raised edge 54 whose upper surface has a size which is at least equal to the size of the slits 71 and 72, in such a manner as to render it possible to alternately close one or the other slit when the slide 50 is moved between its end positions. The central portion of the slide 50 has also a shoe 53 which runs along the bottom 45 of the crucible member 40.

The first slide includes a first portion 51 and a second portion 52 which are positioned on each side of the center portion, and cross the respective ends 44 and 41 of the crucible member 40.

The second slide 60 is a simple plate having a thickness which is substantially equal to the raised edge 54, and, near its end close to the raised edge 54 has an aperture 61 which can cooperate with the pin 43.

As is shown more specifically in FIG. 3c, the substrate carrier member includes receptacle 73 which has in its bottom an aperture 74 surrounded by ribs 75 on which the edges of the substrate 90 bear, the aperture 74 covering the major portion of the lower surface of the substrate 90. A rectangular plate 76 of the same dimensions as the receptacle 73 covers the substrate 90 whilst keeping it on the ribs 75, and also limits the flow of the solutions by more specifically preventing them from wetting the upper surface of the substrate 90.

As is shown in FIGS. 4a–4d, the different operations as regards a dual epitaxy are as follows.

The reservoirs 85 and 86 are filled with saturated ternary solutions A and B, for example consisting of Ga in which GaAs and Al has been disolved to the saturation point with the addition of at least one dopant corresponding to the desired characteristics of the epitaxied layers. In the case of, for example, a diode, the dopants of the two solutions are of the opposite conductivity type.

Figure 4A:
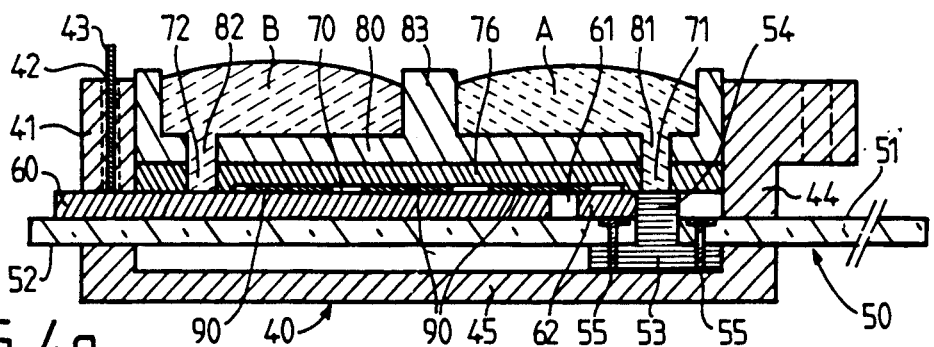
FIGS. 4a and 4d illustrate the mode of operation of the crucible shown in FIGS. 3a and 3b.

In FIG. 4a, the shoe 53 of the slide 53 abuts against the end 44 of the crucible member 40, and its raised edge 54 closes the slit 71, preventing the flow of the solution A. The second slide 60 closes the slit 72, preventing the flow of the solution B. The whole assembly is brought to the first temperature threshold.

Figure 4B:
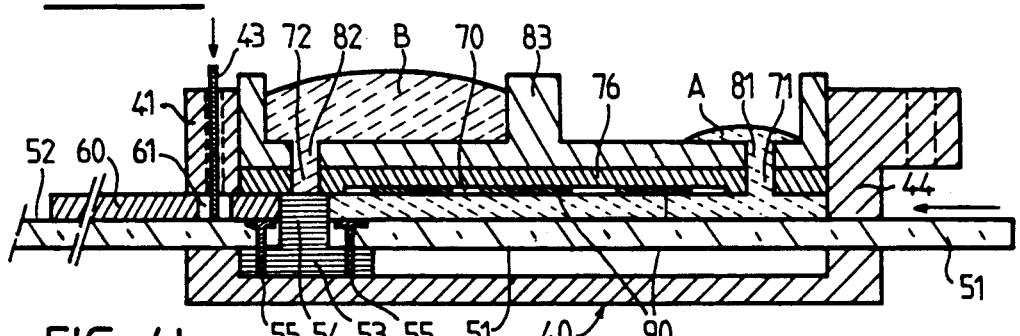
Figure 4C:
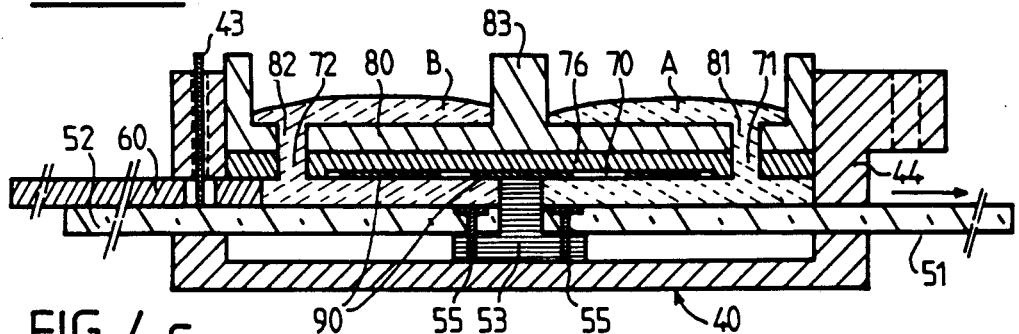
Figure 4D:
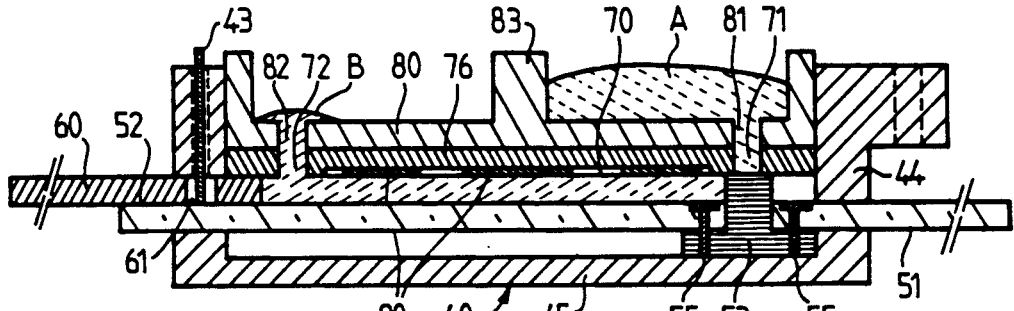

In FIG. 4b, the slide 50 is pushed towards the end 41 of the crucible member 40 until it abuts against the member. The solution A can then flow along the upper side of the first portion of the slide 51 and grazes the lower face of the substrate 90. Then the temperature is decreased to the second temperature in accordance with the rate chosen.

Thereafter the slide 50 is withdrawn in such a manner that the shoe 53 again abuts against the end 44 of the crucible member 40. The second slide 60 remains in position, the pin 43 having dropped by its own weight into the aperture 61, which causes the solution B to cover the second portion 52 of the first slide 50, and to wet the lower surface of the substrate 90. The solution B is saturated in such a manner as to be in equilibrium at the second temperature.

The drop in temperature is effected at the chosen rate (possibly by maintaining the same rate) until the third temperature is reached. The second layer thus realized has a conventional thickness to form, for example, a light-emitting diode. If no other epitaxy is anticipated, the third temperature can be the ambient temperature (the epitaxial growth stops by itself at approximately 550° C.).

FIGS. 5a and 5c show the characteristic curves of the maximum thickness E expressed in microns of an epitaxied GaAlAs layer as a function of, respectively, the rate at which the temperature $d\theta/dt$ varies, expressed in in ° C. per minute, for a starting temperature of 880° C., of the height of the solution expressed in mn for a starting temperature of 880° C., and as a function of the starting temperature expressed in ° C. for a height h of the solution equal to 8 mn and a temperature varying rate $d\theta/dt$ of 0.6° C./mn. The second temperature is of the order of 700° C.

For example, for T=880° C., h=8 mn and $d\theta/dt=0.6°$ C./mn an epitaxied GaAlAs layer is obtained which has a thickness of a little over 200 microns at the end of 5 hours, i.e. a growth rate of 0.7 microns/mn.

For the case in which the object is to produce light-emitting diodes having a transparent substrate, which diodes, as described in the foregoing, require a GaAlAs substrate layer of at least 150 microns thick, an ultimate step which is known per se consists in removing by known means (selective chemical attack) the initial GaAs substrate used in the growth method. Because of the fact that these diodes have a transparent substrate, the light emitted by the diode is absorbed therein to a very low extent, and the luminous efficacies are much higher than the efficiency of diodes having a non-transparent substrate (GaAs).

We claim:

1. A method of obtaining by liquid hetero-epitaxy at least one first monocrystalline layer of a ternary compound on at least one monocrystalline substrate of a binary composition, in which a first solution saturated with the ternary compound is brought into contact with said substrate, the assembly being raised uniformly to a first temperature, thereafter cooled at a first temperature decreasing rate to a second temperature in such a manner as to effect said epitaxy, said first layer having a thickness equal to at least 100 microns, characterized in that said solution-substrate contact is effected by bringing a lower surface of said substrate into contact with an interface of said solution below the surface of said solution, in that the first temperature is comprised between 850° and 880° C., in that the second temperature is of the order of 700° C. and in that the first temperature decreasing rate is comprised between 0.6° and 1.2° C/mn.

2. A method as claimed in claim 1, characterized in that the substrate is made of GaAs of a first conductivity type and the first solution is constituted by Ga in which Al and GaAs have been dissolved, and at least one doping agent, in such a manner as to realize a doped epitaxied layer.

3. A method as claimed in claim 1, characterized in that it includes an ultimate step in which the substrate thus epitaxied is brought into contact with the surface of a second solution of the ternary compound, the assembly being cooled at a second given temperature decreasing rate to a third temperature, to form a second epitaxied layer.

4. A method as claimed in claim 3, characterized in that the substrate is made of GaAs of a first conductivity type, in that the first solution is constituted by Ga in which Al and GaAs have been dissolved and at least one doping agent of the first conductivity type in such manner as to form the first epitaxied layer of having a first conductivity type and in that the second solution is constituted by Ga in which Al and GaAs and at least one doping agent of a second conductivity type which is the opposite of the first conductivity type have been dissolved in such a manner as to provide the second epitaxied layer of the second conductivity type.

5. A method as claimed in claim 3, characterized in that it includes a step in which the substrate of the binary composition is removed.

6. A method as claimed in claim 4, characterized in that it includes a step in which the substrate of the binary composition is removed.

* * * * *